(12) United States Patent
Bai

(10) Patent No.: US 8,685,202 B2
(45) Date of Patent: Apr. 1, 2014

(54) ETCHING DEVICE AND METHOD FOR MANUFACTURING PRINTED CIRCUIT BOARD USING SAME

(75) Inventor: Yao-Wen Bai, Huaian (CN)

(73) Assignees: Hong Heng Sheng Electronical Technology (HuaiAn) Co., Ltd, Huaian (CN); Zhen Ding Technology Co., Ltd., Tayuan, Taoyuan (TW)

( * ) Notice: Subject to any disclaimer, the term of this patent is extended or adjusted under 35 U.S.C. 154(b) by 171 days.

(21) Appl. No.: 13/087,390

(22) Filed: Apr. 15, 2011

(65) Prior Publication Data

US 2012/0031873 A1 Feb. 9, 2012

(30) Foreign Application Priority Data

Aug. 5, 2010 (CN) .......................... 2010 1 0246300

(51) Int. Cl.
*C23F 1/00* (2006.01)

(52) U.S. Cl.
USPC ............ 156/345.17; 156/345.11; 156/345.21; 134/95.3

(58) Field of Classification Search
USPC ............ 438/745, 749; 156/345.1, 11, 12, 17, 156/18, 345.11, 345.12, 345.17, 345.18, 156/345.21; 134/95.3, 131
See application file for complete search history.

(56) References Cited

U.S. PATENT DOCUMENTS

| 4,887,760 | A | * | 12/1989 | Yoshino et al. | ............... 228/56.3 |
| 6,003,527 | A | * | 12/1999 | Netsu et al. | .................... 134/1.3 |
| 6,179,954 | B1 | * | 1/2001 | Kawana et al. | .......... 156/345.21 |
| 6,290,863 | B1 | * | 9/2001 | Morgan et al. | ................... 216/73 |

* cited by examiner

*Primary Examiner* — Lan Vinh
(74) *Attorney, Agent, or Firm* — Novak Druce Connolly Bove + Quigg LLP

(57) ABSTRACT

In a method for manufacturing a printed circuit board, a substrate, including a number of plated through holes (PTHs) is provided. Each of the PTHs has an electrically conductive layer plated on its inner wall and includes an electrically connecting portion and a stub. A protective layer is formed on a surface of the substrate adjacent to the stub. An etching device, including an upper plate and a number of spray tubes corresponding to the PTHs, is provided. Each of the spray tubes includes a protruding portion beyond the upper plate. The substrate is arranged in such a manner that the protective layer is in contact with the upper plate and the protruding portions are received in the stubs. After that, the protruding portions spray an etchant to etch and remove the electrically conductive layer of the stubs, and the protective layer is removed.

18 Claims, 12 Drawing Sheets

_US 8,685,202 B2_

ETCHING DEVICE AND METHOD FOR MANUFACTURING PRINTED CIRCUIT BOARD USING SAME

BACKGROUND

1. Technical Field

The present disclosure generally relates to technology of manufacturing printed circuit boards (PCBs), and particularly, to an etching device and a method for manufacturing a PCB without stubs using same.

2. Description of Related Art

PCBs are widely used in various electronic devices such as mobile phones, printers, and hard disk drives. A PCB always includes a number of circuit layers, and a number of plated through holes (PTHs) electrically connecting the circuit layers. Most of the PTHs each include a stub, which obscures or reduces the clarity of the signal transmitted in the circuit layers.

A frequently applied process applies a back-drilling technique to the PCB to remove the stub of the PTH. However, the accuracy of the back-drilling process is hard to control, and circuits in the circuit layers of the PCB may be damaged accordingly.

What is needed, therefore, is an etching device and a method for manufacturing a PCB without stubs that overcomes the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments will now be described in detail below and with reference to the drawings.

A method for manufacturing a printed circuit board (PCB) is described in detail as follows.

Figure 1:
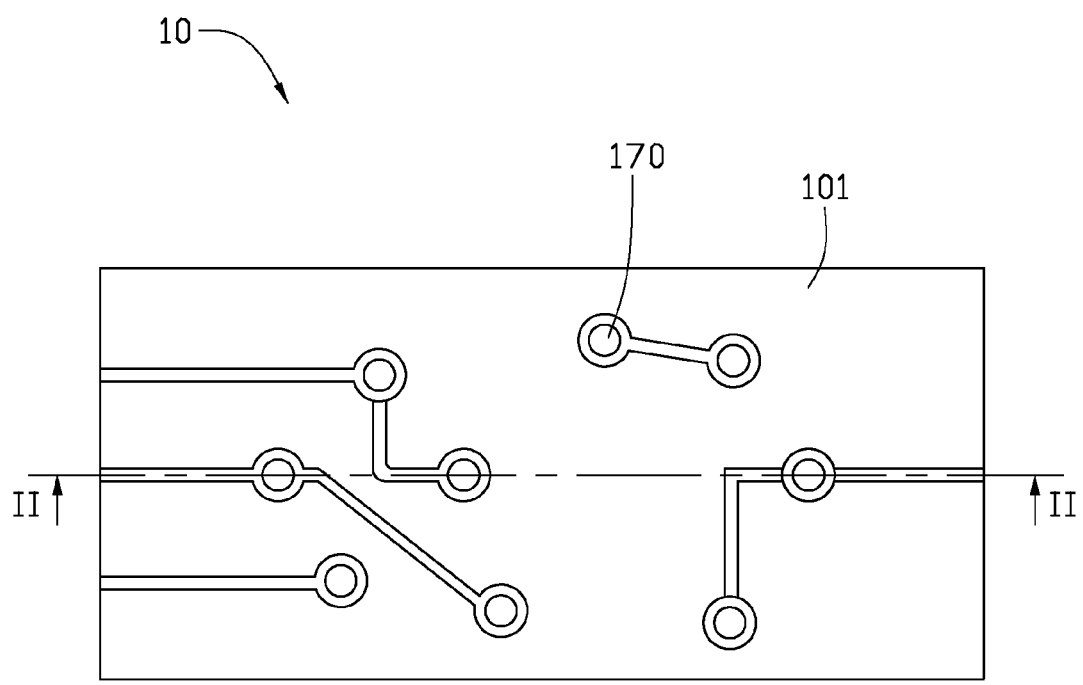
FIG. 1 is a top view of a multilayer substrate in accordance with an exemplary embodiment.
Figure 2:
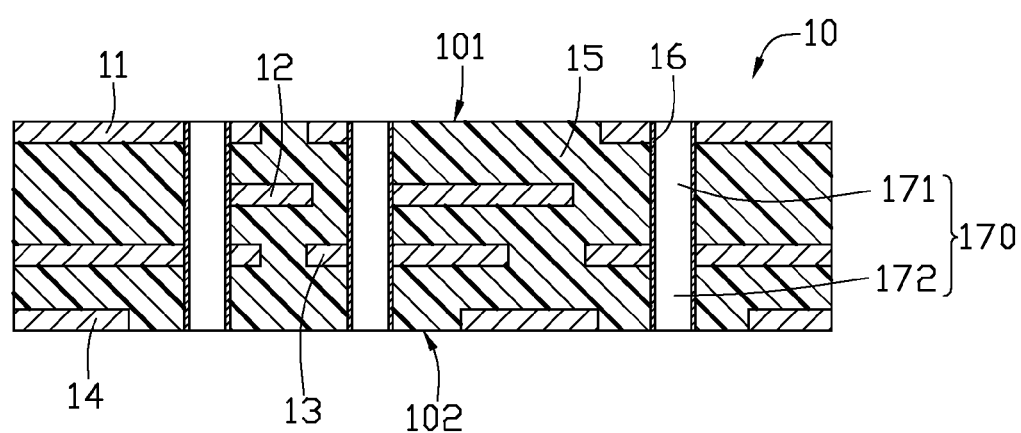
FIG. 2 is a sectional view of the multilayer substrate of FIG. 1, taken along line II-II thereof.

Referring to FIGS. 1 and 2, a multilayer substrate 10 is provided. In the illustrated embodiment, the substrate 10 is a four-layer PCB substrate, and includes a first circuit layer 11, a second circuit layer 12, a third circuit layer 13, a fourth circuit layer 14, and an insulated matrix 15. The first through fourth circuit layers 11 through 14 are all embedded in the insulated matrix 15 and spaced from each other. The substrate 10 has a top surface 101 and a bottom surface 102. The first circuit layer 11 is exposed at the top surface 101, the fourth circuit layer 14 is exposed at the bottom surface 102, and the second and third circuit layers 12 and 13 are arranged between the first and the fourth circuit layers 11 and 14. The substrate 10 defines a number of plated through holes (PTHs) 170, each of exposed at both of the top and bottom surfaces 101 and 102. The PTHs 170 each have an electrically conductive layer 16 plated on its inner wall, and are configured for electrically connecting at least two of the first through fourth circuit layers 11 through 14. The material of the electrically conductive layer 16 can be copper. In the illustrated embodiment, only PTHs 170 electrically connecting at least two of the first, second, and third circuit layers 11, 12, and 13, are shown in FIGS. 1 and 2. Such PTHs 170 of FIGS. 1 and 2 each include an electrically connecting portion 171 and a stub 172 connected with the electrically connecting portion 171. The electrically connecting portion 171 is adjacent to the top surface 101, and electrically connects at least two of the first, second, and third circuit layers 11, 12, and 13. The stub 172 is adjacent to the bottom surface 102, and has no positive effect on the substrate 10.

Figure 3:
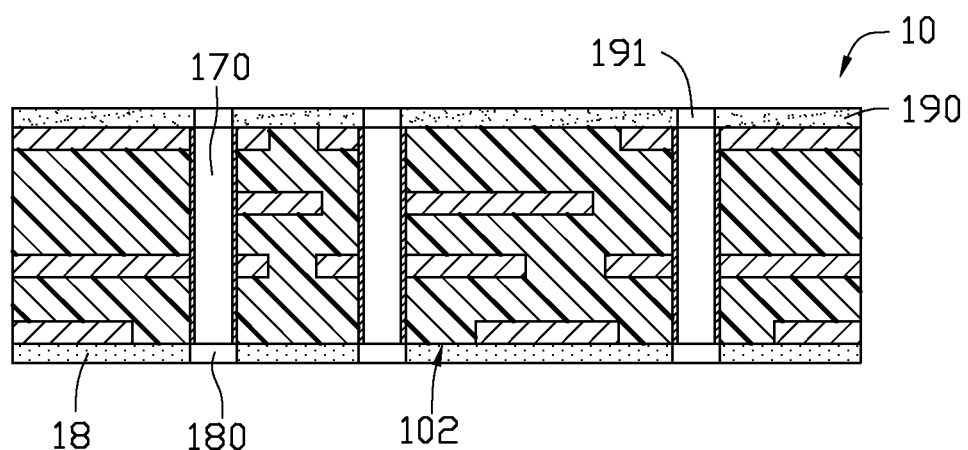
FIG. 3 is similar to FIG. 2, but shows a protective layer being attached to the multilayer substrate.

Referring to FIG. 3, a protective layer 18 is formed on the bottom surface 102 of the substrate 10, and a first solder mask layer 190 is formed on the top surface 101 of the substrate 10. The protective layer 18 can be ink, photo resist material, solder resist material, or any other suitable material capable of protecting the fourth circuit layer 14. A number of first openings 180 are defined in the protective layer 18, to expose the PTHs 170 of the substrate 10. Similarly, a number of second openings 191 corresponding to the PTHs 170 are defined in the first solder mask layer 190.

Figure 4:
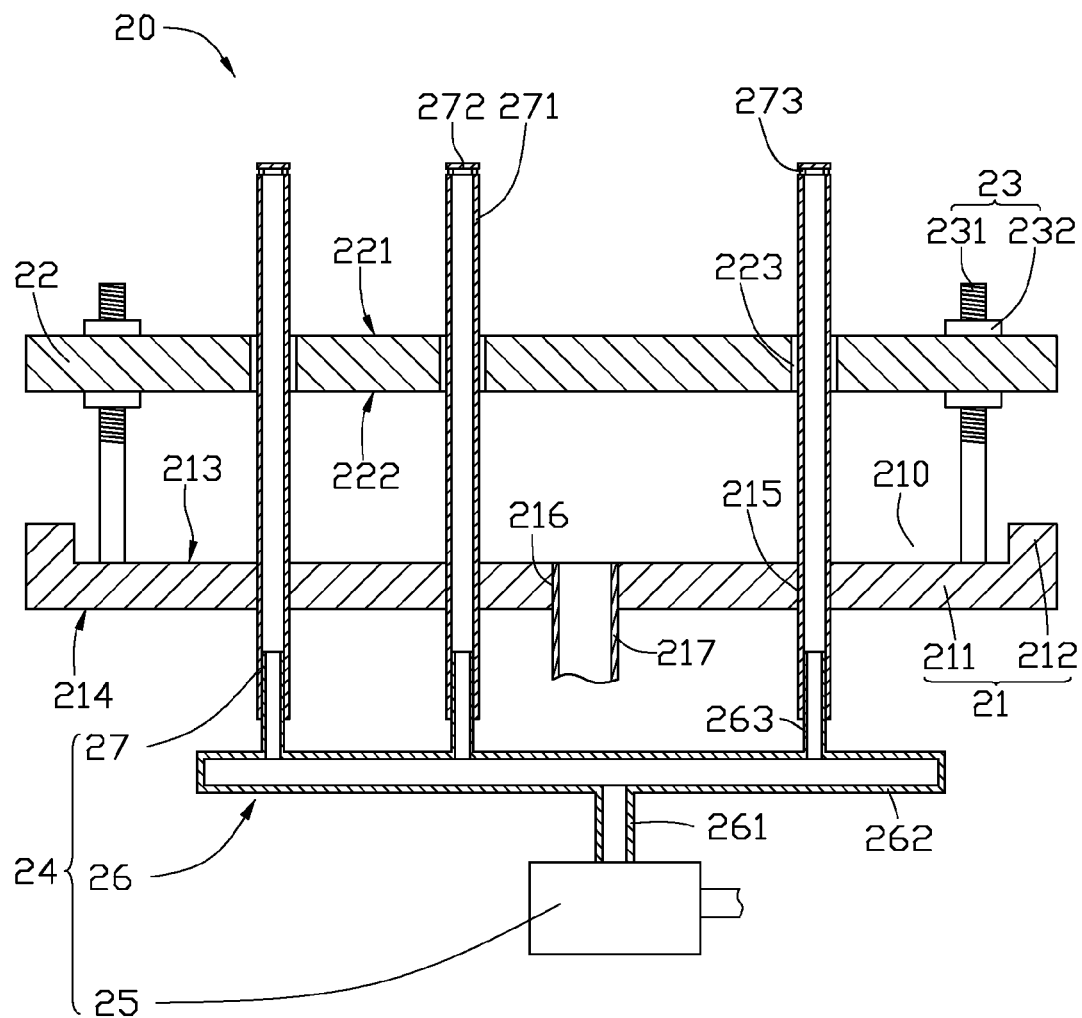
FIG. 4 is a schematic view of an etching device in accordance with an exemplary embodiment, wherein the etching device includes an upper plate, a lower plate, and a number of spray tubes.

Referring to FIG. 4, an etching device 20, configured for spraying an etchant to etch and remove the electrically conductive layer 16 of the stubs 172 of the substrate 10, is provided. The etching device 20 includes a lower plate 21, an upper plate 22, a connecting mechanism 23, and a spraying mechanism 24.

Figure 5:
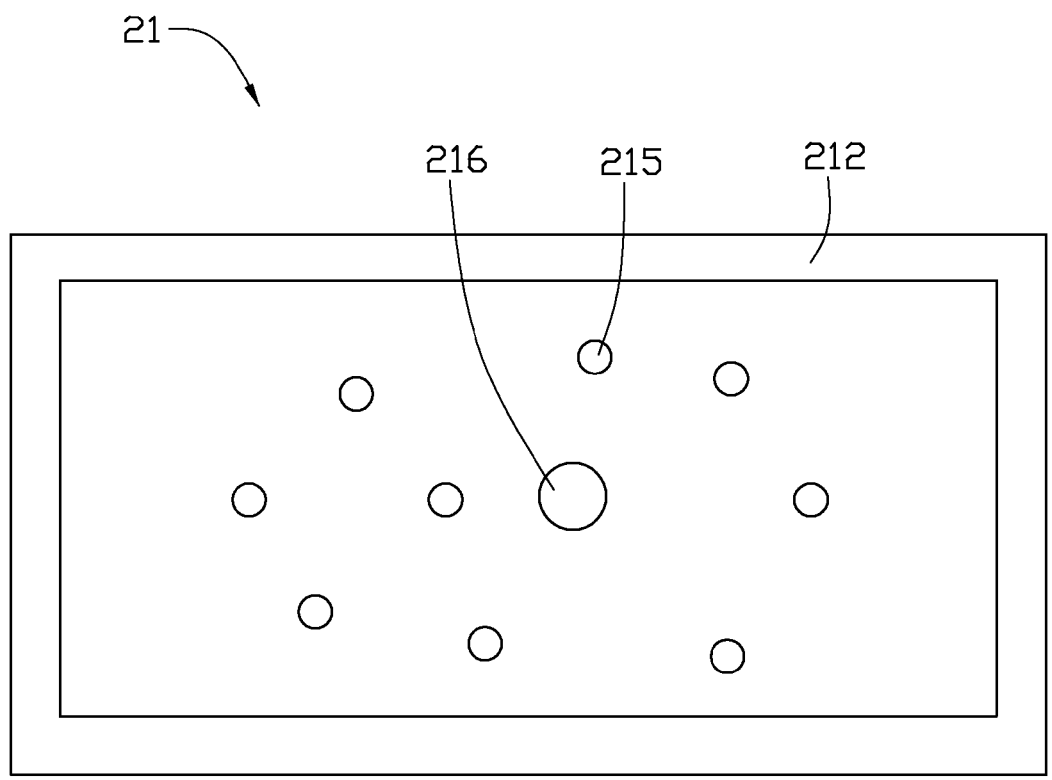
FIG. 5 is a top view of the lower plate of the etching device of FIG. 4.

Referring to FIGS. 4 and 5, the lower plate 21 includes a main body 211 and an annular protrusion 212 extending along a periphery of the main body 211. In the illustrated embodiment, the main body 211 has a rectangular cross-section, and the annular protrusion 212 is rectangular in shape. The main body 211 has a first supporting surface 213 and a first back surface 214, and defines a number of first through holes 215 and at least one drainage hole 216 therein. The annular protrusion 212 extends from a peripheral portion of the first top surface 213 toward the upper plate 22, thus the annular protrusion 212 and the first supporting surface 213 of the main body 211 define a retaining space 210.

The first through holes 215 and the drainage hole 216 are each exposed at both of the first supporting surface 213 and the first back surface 214. The first through holes 215 are defined corresponding to the PTHs 170 having stubs 172 of the substrate 10. The at least one drainage hole 216 may be a number of drainage holes 216 randomly defined in the main body 211 of the lower plate 21, or may be one drainage hole 216 defined at a central portion of the main body 211 of the lower plate 21. At least one drainage conduit 217 is mounted at the at least one drainage hole 214, and is in communication with the retaining space 210.

Figure 6:
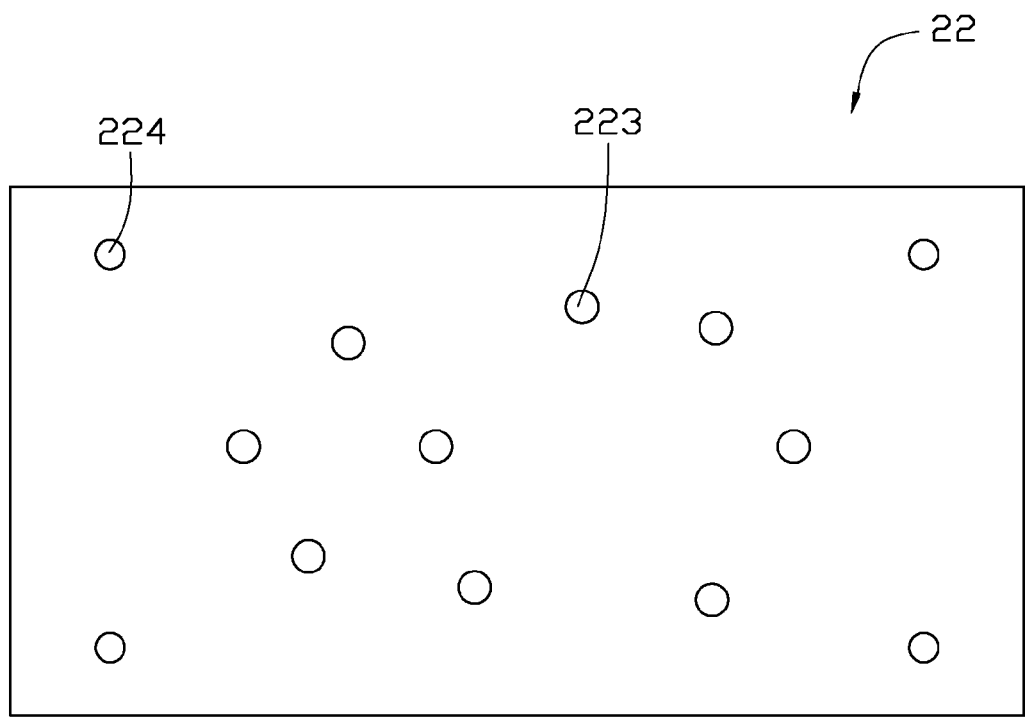
FIG. 6 is a top view of the upper plate of the etching device of FIG. 4.

Referring to FIGS. 4 and 6, the upper plate 22 is arranged above the lower plate 21, and has a second supporting surface 221 and a second back surface 222 opposite to the first supporting surface 221. The second supporting surface 222 is configured for supporting and contacting the protective layer 17 of the substrate 10. The upper plate 22 defines a number of second through holes 223 and four threaded holes 224 therein. The second through holes 223 correspond to the first through holes 215, and a diameter thereof exceeds that of the first through hole 215. In detail, the diameter of the second through hole 223 is from 108% to 115% of the diameter of the first through hole 215. The threaded holes 224 cooperate with the connecting mechanism 23, and are defined at a peripheral portion of the upper plate 22. In the illustrated embodiment, the upper plate 22 is rectangular, the threaded holes 224 are adjacent to four right angles of the upper plate 22, respectively.

The connecting mechanism 23 connects the upper and lower plates 21 and 22 together. In the illustrated embodiment, the connecting mechanism 23 includes four fasteners 231 and eight threaded retainers 232. The fasteners 231 are fixed at the peripheral portion of the main body 211, and extend toward the upper plate 22. In particular, the fasteners 231 each extend through the threaded holes 224 and protrude beyond the second supporting surface 221. One end of each of the fasteners 231 is fixed on the first top surface 213 and adjacent to a respective right angle thereof, and the other end of each of the fasteners 231 is threaded. Two threaded retainers 232 are received on each of the fasteners 231, one in contact with the second supporting surface 221, and the other in contact with the second back surface 222. It is understood that the number of the fasteners 231 is equal to that of the threaded holes 224, and the number of the threaded holes 224 is not limited to four, according to practical need. In addition to fasteners 231 and threaded retainers 232, the connecting mechanism 23 can be other mechanical connecting members, such as an adhesive tape, positioned between and interconnecting the annular protrusion 212 and the peripheral portion of the upper plate 22.

The spraying mechanism 24 includes a pump 25, a connecting channel system 26, and a number of spray tubes 27. The pump 25 supplies an etchant to the spray tubes 27 via the connecting channel system 26, and the etchant is capable of etching the electrically conductive layer 16 of the PTHs 170. For example, the etchant can be acid cupric chloride etchant capable of etching copper.

The connecting channel system 26 includes a connecting conduit 261, a main conduit 262, and a number of distributing conduits 263. The connecting conduit 261 is in communication with the pump 25, the main conduit 262 interconnects the connecting conduit 261 and each of the distributing conduits 263. The distributing conduits 263 are in fluid communication with the spray tubes 27, respectively.

A diameter of the spray tube 27 is substantially equal to or larger than that of the first through hole 215. A diameter of the spray tube 27 is less than that of the second through hole 223. The spray tubes 27 each extend through a corresponding first through hole 215 of the lower plate 21 and a corresponding second through hole 223 of the upper plate 22, and protrude beyond the upper plate 22. The spray tubes 27 seal the respective first through holes 215, and there is no gap between the spray tubes 27 and the lower plate 21. That is, a transition fit or interference fit between the spray tubes 27 and the first through holes 215 ensures the spray tubes 27 are fixed at the lower plate 21.

Each of the spray tubes 27 includes a protruding portion 270 protruding beyond the second supporting surface 222. The protruding portion 270 includes a side wall 271 and a top wall 272 connected with the side wall 271. At least one spraying opening 273 is defined at the side wall 271 and adjacent to the top wall 272. The protruding portions 270 of the spray tubes 27 are configured for inserting into stubs 172 of the substrate 10, and the spraying openings 273 of the spray tubes 27 are configured for spraying the etchant to the stubs 172 of the substrate 10. That means, the electrically conductive layer 16 of the stubs 172 can be etched and removed by the etching device 20.

Figure 7:
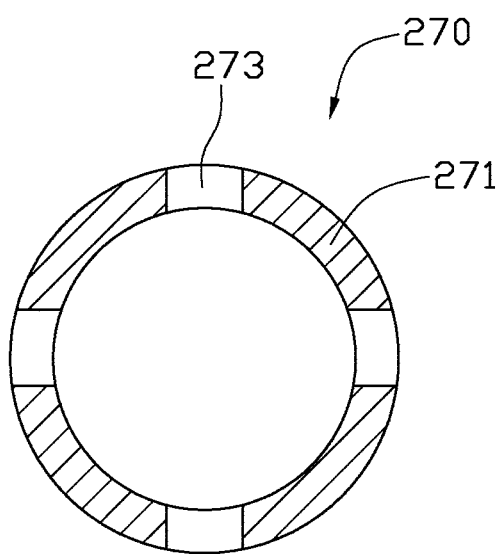
FIG. 7 is a schematic view of the spray tubes of the etching device in accordance with one embodiment.
Figure 8:
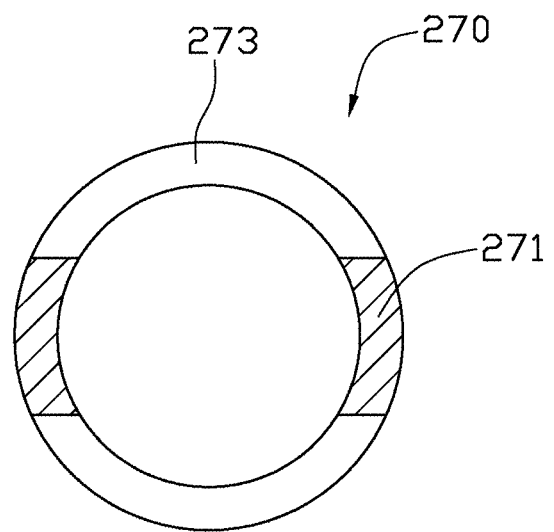
FIG. 8 is a schematic view of the spray tubes of the etching device in accordance with another embodiment.
Figure 9:
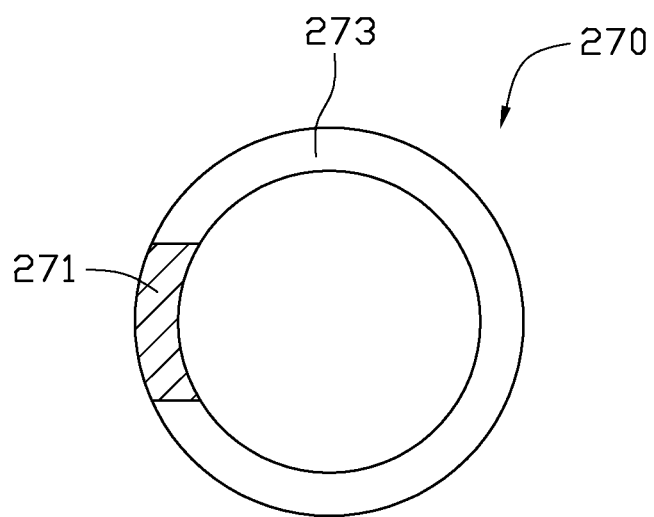
FIG. 9 is a schematic view of the spray tubes of the etching device in accordance with a third embodiment.

In one embodiment, the at least one spraying opening 273 includes four spraying openings 273 equiangularly arranged about a central axis of the spray tube 27, as shown in FIG. 7. In another embodiment, the at least one spraying opening 273 includes two spraying openings 273 opposite to each other, as shown in FIG. 8. In a third embodiment, the at least one spraying opening 273 includes one C-shape spraying opening 273 as shown in FIG. 9.

Figure 10:
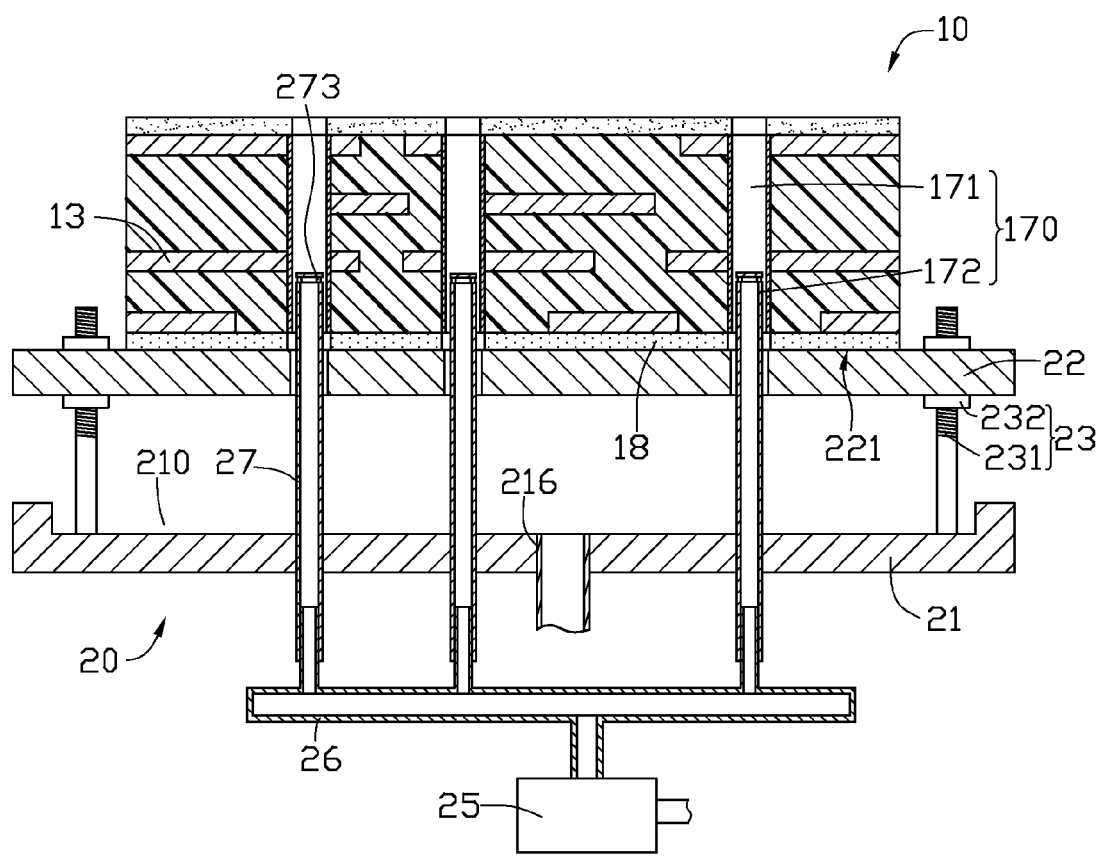
FIG. 10 is similar to FIG. 4, but shows the multilayer substrate of FIG. 2 on the upper plate.

Referring to FIG. 10, the substrate 10 is placed on the upper plate 22 in such a manner that the protective layer 17 is in contact with the second supporting surface 222 of the upper plate 22 and the protruding portion 270 of each of the spray tubes 27 is received in a corresponding stub 172. The distance between the upper plate 22 and the lower plate 21 can be adjusted by changing the location between the threaded retainers 132 and the fasteners 131. As such, the length of the protruding portion 270 can be accordingly adjusted. The length of the protruding portion 270 should be adjusted to substantially equal the length of the stub 172, thus the at least one spraying opening 273 is adjacent to the end of the stub 172 connected with the electrically connecting portion 171. In the illustrated embodiment, the spraying opening 273 is below and adjacent to the third circuit layer 13.

Figure 11:
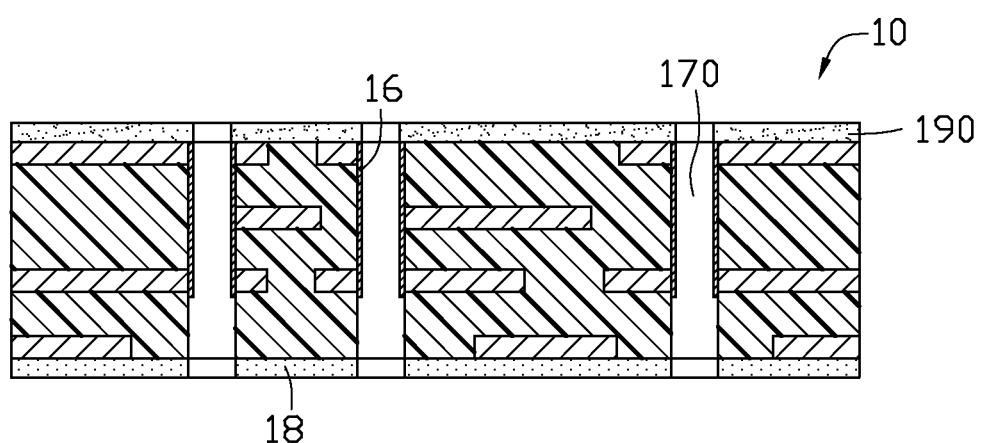
FIG. 11 is similar to FIG. 2, but shows stubs of the multilayer substrate being removed.

Referring to FIGS. 10 and 11, the pump 25 pumps the etchant to the spray tubes 27, and the spraying openings 273 of the spray tubes 27 spray the etchant to the electrically conductive layer 16 of the stubs 172. The etchant is sprayed onto an inner wall of the electrically conductive layer 16 of the stub 172, and then flows along the inner wall of the electrically conductive layer 16 and etches the electrically conductive layer 16. After that, the etchant flows through the second through holes 224 of the upper plate 22 and is received in the retaining space 210. Finally, the etchant is drained out from the drainage hole 216 of the lower plate 21. The pump 25 pumps the etchant to the spray tubes 27 until the electrically conductive layer 16 of the stubs 172 is etched and removed by the etchant.

Figure 12:
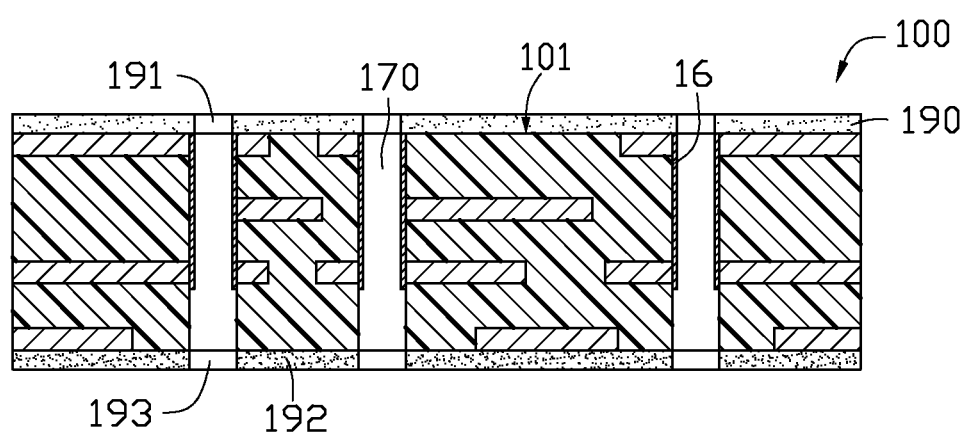
FIG. 12 is similar to FIG. 11, but shows a second solder mask layer being attached to the multilayer substrate.

Referring to FIG. 12, the protective layer 17 is removed from the substrate 10. Then, a second solder mask layer 192 can be attached to the bottom surface 102 and thus a four-layer PCB 100 is obtained.

It should be emphasized that the described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. An etching device for removing stubs of plated through holes of a substrate, the device comprising:
   a lower plate defining a plurality of first through holes, the first through holes running through two opposite surfaces of the lower plate;
   an upper plate configured for supporting the substrate, the upper plate being above the lower plate and defining a plurality of second through holes aligned with the respective first through holes, the first through holes running through two opposite surfaces of the lower plate, a diameter of the second through hole being larger than that of the first through hole;
   a connecting mechanism connecting the upper plate and the lower plate together; and
   a spraying mechanism comprising a pump and a plurality of spray tubes, the pump being configured for supplying an etchant to the spray tubes, a diameter of the spray tube being less than that of the second through hole, the spray tubes each extending through a corresponding first through hole and a corresponding second through hole, each of the spray tubes including a protruding portion protruding beyond the upper plate and configured for extending into the stub, the protruding portion defining at least one spraying opening, the at least one spraying opening being configured for spraying the etchant to the stub of the substrate.

2. The etching device of claim 1, wherein the diameter of the second through hole is in the range from 108% to 115% of the diameter of the first through hole.

3. The etching device of claim 1, wherein a diameter of the spray tube is equal to or larger than that of the first through hole.

4. The etching device of claim 1, wherein the spray tubes seal the respective first through holes.

5. The etching device of claim 1, wherein the lower plate includes a main body and an annular protrusion extending along a periphery of the main body, the main body comprising a first supporting surface, a first back surface, and at least one drainage hole exposed at both of the first supporting and the first back surfaces, the annular protrusion extending from the first supporting surface toward the upper plate, a retaining space being bounded by the annular protrusion and the first supporting surface, the at least one drainage hole being in communication with the retaining space.

6. The etching device of claim 5, wherein the upper plate comprises a second supporting surface and a second back surface opposite to the main body, the upper plate defines a number of threaded holes exposed at both of the second supporting and the second back surfaces, the connecting mechanism comprises a number of fasteners and a number of threaded retainers, the fasteners each are fixed on the main body and extend through a corresponding threaded hole, there are two threaded retainers screwed on each of the fasteners, one in contact with the second supporting surface, the other in contact with the second back surface.

7. The etching device of claim 5, wherein the connecting mechanism comprises at least one adhesive tape positioned between the annular protrusion and the periphery of the upper plate.

8. The etching device of claim 1, wherein the protruding portion comprises a side wall and a top wall connected with the side wall, the at least one spraying opening is defined in the side wall adjacent to the top wall.

9. The etching device of claim 8, wherein the at least one spraying opening comprises a number of spraying openings equiangularly arranged about a central body axis of the protruding portion.

10. The etching device of claim 8, wherein the at least one spraying opening comprises two spraying openings opposite to each other.

11. The etching device of claim 8, wherein the at least one spraying opening comprises a C-shaped spraying opening.

12. An etching device for removing stubs of plated through holes of a substrate, the device comprising:
    a lower plate comprising a main body and an annular protrusion connected with a peripheral portion of the main body, the main body defining a plurality of first through holes, the first through holes running through two opposite surfaces of the main body;
    an upper plate configured for supporting the substrate, the upper plate being above the main body and defining a plurality of second through holes aligned with the respective first through holes, the first through holes running through two opposite surfaces of the lower plate, a diameter of the second through hole being larger than that of the first through hole;
    a connecting mechanism connecting the upper plate and the lower plate together; and
    a spraying mechanism comprising a pump and a plurality of spray tubes, the pump being configured for supplying an etchant to the spray tubes, a diameter of the spray tube being less than that of the second through hole, the spray tubes each extending through a corresponding first through hole and a corresponding second through hole, the spray tubes sealing the respective first through holes, each of the spray tubes including a protruding portion protruding beyond the upper plate and configured for extending into the stub, the protruding portion defining at least one spraying opening, the at least one spraying opening being configured for spraying the etchant to the stub of the substrate.

13. The etching device of claim 12, wherein a diameter of the spray tube is equal to or larger than that of the first through hole.

14. The etching device of claim 12, wherein the spray tubes seal the respective first through holes.

15. The etching device of claim 12, wherein the protruding portion comprises a side wall and a top wall connected with the side wall, the at least one spraying opening is defined in the side wall adjacent to the top wall.

16. The etching device of claim 15, wherein the at least one spraying opening comprises a number of spraying openings equiangularly arranged about a central body axis of the protruding portion.

17. The etching device of claim 15, wherein the at least one spraying opening comprises two spraying openings opposite to each other.

18. The etching device of claim 15, wherein the at least one spraying opening comprises a C-shaped spraying opening.

* * * * *